(12) United States Patent
Barnett et al.

(10) Patent No.: US 7,106,138 B2
(45) Date of Patent: Sep. 12, 2006

(54) CONTINUOUSLY VARIABLE GAIN RADIO FREQUENCY DRIVER AMPLIFIER HAVING LINEAR IN DECIBEL GAIN CONTROL CHARACTERISTICS

(75) Inventors: Kenneth Barnett, Oceanside, CA (US); Brett C. Walker, San Diego, CA (US); Kevin Gard, Raleigh, NC (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 11/152,445

(22) Filed: Jun. 13, 2005

(65) Prior Publication Data

US 2006/0038617 A1 Feb. 23, 2006

Related U.S. Application Data

(63) Continuation of application No. 10/700,860, filed on Nov. 3, 2003, now Pat. No. 6,906,592.

(60) Provisional application No. 60/426,154, filed on Nov. 13, 2002, provisional application No. 60/476,311, filed on Jun. 6, 2003.

(51) Int. Cl.
*H03G 3/30* (2006.01)

(52) U.S. Cl. ...................................... 330/289; 330/283
(58) Field of Classification Search ................ 330/256, 330/283
See application file for complete search history.

(56) References Cited

U.S. PATENT DOCUMENTS

| | | | | |
|---|---|---|---|---|
| 3,942,181 A | * | 3/1976 | Berrod et al. | 342/92 |
| 5,105,165 A | * | 4/1992 | Bien | 330/149 |
| 6,414,547 B1 | * | 7/2002 | Shkap | 330/149 |

\* cited by examiner

*Primary Examiner*—Steven J. Mottola
(74) *Attorney, Agent, or Firm*—Philip Wadsworth; Charles D. Brown; George C. Pappas

(57) ABSTRACT

A radio frequency (RF) driver amplifier system and method that provides linear in decibel gain control is provided. The RF driver amplifier system comprises a linear transconductor receiving an input voltage and providing a controlled current based on input voltage received, temperature compensation circuitry for varying current from the linear transconductor according to absolute temperature, an exponential current controller receiving current varied according to temperature and providing an exponential current in response, and an inductive degeneration compensator receiving exponential current and providing a control current to driver amplifier circuitry, thereby compensating for inductive degeneration due to at least one inductor in the driver amplifier circuitry. Control current passes from the inductive degeneration compensator to the driver amplifier circuitry. Output gain from the driver amplifier circuitry varies linearly in decibels with respect to the input voltage.

48 Claims, 8 Drawing Sheets

CONTINUOUSLY VARIABLE GAIN RADIO FREQUENCY DRIVER AMPLIFIER HAVING LINEAR IN DECIBEL GAIN CONTROL CHARACTERISTICS

CROSS-REFERENCE TO RELATED APPLICATIONS

This application is a continuation of Utility Application No. 10/700,860 entitled "Continuously Variable Gain Radio Frequency Driver Amplifier Having Linear in Decibel Gain Control Characteristics," granted as U.S. Pat. No. 6,906,592 on Jun. 14, 2005; filed on Nov. 3, 2003 claiming the benefit of U.S. Provisional Application Ser. No. 60/426,154 filed on Nov. 13, 2002 and U.S. Provisional Application Ser. No. 60/476,311 filed on Jun. 6, 2003.

BACKGROUND

1. Field

The present invention relates generally to the field of communications and more specifically to providing specific gain control characteristics in Radio Frequency (RF) driver amplifiers (DAs).

2. Background

In a wireless communications system, a user having a terminal (e.g., a cellular phone) communicates with another user via transmissions on the downlink (forward link) and the uplink (reverse link) through one or more base stations. Downlink refers to transmission from the base station to the terminal, while uplink refers to transmission from the terminal to the base station.

Cellular telecommunications systems, such as Code Division Multiple access (CDMA) communications systems, are often characterized by a plurality of mobile stations, or terminals (e.g. cellular telephones, mobile units, wireless telephones, or mobile phones) in communication with one or more Base Station Transceiver Subsystems (BTSs). Signals transmitted by the mobile stations are received by a BTS and often relayed to a Mobile Switching Center (MSC) having a Base Station Controller (BSC). Alternately, mobile station transmissions may be received by a BTS and relayed to a Public Data Serving Node (PDSN) through a BSC. The MSC and the PDSN, in turn, route the signal to a Public Switched Telephone Network (PSTN), a data network, or to another terminal. Similarly, a signal may be transmitted from the PSTN or data 00network to a terminal via a base station or BTS and an MSC, or via a BTS, a BSC, and a PDSN.

The output stage of a wireless communication device, or terminal, employed in connection with the foregoing wireless communication system typically includes amplifiers that strengthen the radio frequency (RF) transmission in the foregoing system. For example, the wireless communication device may be a CDMA wireless communication device or terminal that employs one or more RF amplifiers to provide an adequate radar frequency signal transmission.

In a direct conversion transmitter architecture, controlling RF driver amplifier gain is generally desirable for a variety of reasons. For example, CDMA standards require a transmitter having approximately 90 dB of gain control range. Typical high volume, manufacturable single stage Variable Gain Amplifier (VGA) circuitry can only attain in the range of approximately 60 dB of gain control range. As the VGA is typically located at the output of the direct upconverter in the design shown, it can be difficult if not impossible to increase the gain range in the presence of previous VGA circuitry.

Linear in decibel gain control characteristics provide certain advantages in CDMA applications. Power control requirements in CDMA, for example, require tight control over the output power of the terminal. Phone output power is preferably calibrated and repeatable against the received power control voltage. Total average power consumption is preferably kept to a minimum, and power consumption can be reduced in the presence of a variable gain at the RF driver amplifier.

When implementing a gain control function in a driver amplifier, adequate linearity and noise performance must be available when delivering a significant level of output power, such as in the range of approximately 10 dBm. Linear in decibel gain control is particularly difficult due to package parasitics and bondwire inductances in the integrated circuit design of the driver amplifier.

Previous RF systems seeking enhanced gain control over the 90 dB range have employed different designs with mixed results. For example, certain designs use multiple VGAs, as a single VGA only generally provides 40 to 60 dB of gain control. A dual VGA setup can increase the gain control range, but this design is difficult to operate at a single frequency in the desired operational frequency range, and is difficult to tune, bias, and calibrate properly. A dual VGA system can be used for a dual conversion (superheterodyne) architecture, as each VGA can operate at a different frequency in such a design. Such a design can be undesirable because of current drain, additional required circuitry and more complex circuitry, requires more area, and is more expensive in an IC circuit design. Generally speaking, any design employing multiple VGA circuits or designs having the effect of multiple VGA circuits are undesirable in direct conversion systems in particular.

Previous designs have also employed transmit integrated circuits within the terminal to use a variable bias current in the drive amplifier. Variation in the output current has been observed to be on the order of four to one over the full gain control range. While this can reduce current drain at low output power levels, the gain is not varied in an appreciable manner in this implementation.

It would therefore be advantageous to provide a RF driver amplifier linear in decibel variable gain design for direct conversion transmitter applications, particularly variable linearly over the range of zero to 90 dB that overcomes the drawbacks of previous designs.

SUMMARY

The aspects described herein are directed to a radio frequency (RF) driver amplifier system that provides linear in decibel gain control. According to one aspect of the present design, the linear in decibel gain control is provided in response to gain control voltage received. The RF driver amplifier system has driver amplifier circuitry including a bipolar junction transistor and a matching circuit. The RF driver amplifier system comprises a linear transconductor receiving an input voltage and providing a controlled current based on input voltage received, temperature compensation circuitry for varying current from the linear transconductor according to absolute temperature, an exponential current controller receiving current varied according to temperature from the temperature compensation circuitry and providing an exponential current in response, and an inductive degeneration compensator receiving exponential current from the exponential current controller and providing a control current to the driver amplifier circuitry compensating for inductive degeneration due to at least one inductor in the driver amplifier circuitry. According to this aspect of the design, control current passes from the inductive degeneration compensator to the driver amplifier circuitry and bipolar junction transistor and matching circuit. Output gain from the driver amplifier circuitry varies linearly in decibels with respect to the input voltage.

According to a second aspect of the present design, there is provided an apparatus for providing linear in decibel gain control based on a voltage received. The apparatus comprises a voltage to current converter that converts the voltage received into a current, a temperature compensation circuit that compensates the current for temperature changes into a temperature compensated current, and an exponential current control and inductive degeneration compensation circuit that receives the temperature compensated current and removes inductive degeneration effects to provide a reference current used to provide linear in decibel gain control.

According to a third aspect of the present design, there is provided a system for providing linear in decibel gain control for an RF driver amplifier, comprising means for providing a current, means for temperature compensating the current into a temperature compensated current, means for exponentially controlling the temperature compensated current into an exponentially controlled current, and means for compensating for inductive degeneration of the exponentially controlled current, thereby producing a reference current used to provide linear in decibel gain control.

According to a fourth aspect of the present design, there is provided a method for providing linear in decibel gain control in an RF driver amplifier, comprising generating a current, temperature compensating the current into a temperature compensated current, and exponentially controlling the temperature compensated circuit into an exponentially controlled current.

According to a fifth aspect of the present design, there is provided a method for providing variable gain RF drive amplification to driver amplifier circuitry comprising at least one inductor. The variable gain is substantially linear in decibel gain control with respect to a received input voltage. The method according to this aspect comprises generating a current control signal, comprising receiving the input voltage and converting the input voltage to a current, compensating the current for temperature effects by varying the current according to absolute temperature to produce a temperature compensated current, providing a controlled exponential current based on the temperature compensated current, and compensating for inductive degeneration in the controlled exponential current, the compensating comprising altering the current to address high current effects for at least one inductor in the driver amplifier circuitry. The result of the compensating is creation of a control current passed to the driver amplifier circuitry.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein.

DETAILED DESCRIPTION

Figure 1:
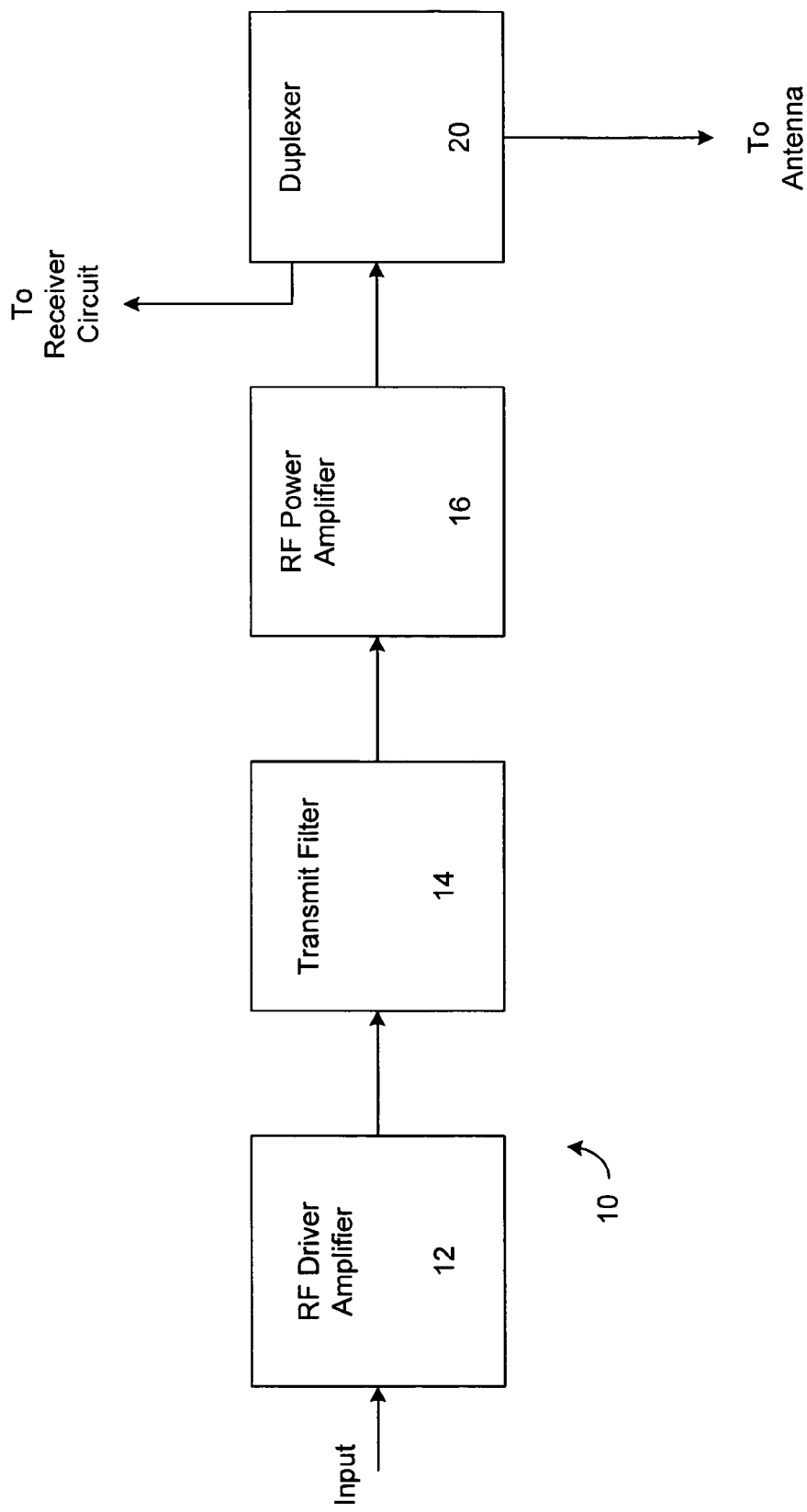
FIG. 1 illustrates a general block diagram of an output stage for a wireless communication device or terminal.

A typical output stage 10 for a wireless communication device is illustrated in FIG. 1 and comprises an RF driver amplifier 12, a transmit filter 14, and an RF power amplifier 16. An output port of the RF driver amplifier 12 is coupled to an input port of the transmit filter 14. Similarly, an output port of the transmit filter 14 is coupled to an input port of the RF power amplifier 16. An input 18 to the RF driver amplifier 12 originates from other circuitry not illustrated in FIG. 1. Those skilled in the art will appreciate that other circuitry may include, for example, processing circuitry such as a modulator. In a CDMA environment, additional circuitry not present in FIG. 1 may include CDMA processing circuitry and a CDMA modulator circuit, among other elements.

An output from the RF power amplifier 16 may be coupled to a duplexer 20, the output of which is coupled to an antenna circuit (not shown), which may include an antenna (also not shown). The duplexer 20 permits the antenna to be used for both transmission and reception of radio frequency signals. In one exemplary aspect of the device, the transmit filter 14 may be a bandpass filter selected to match the frequency range of operation of the wireless communication device. The transmit filter 14 may be implemented as a SAW filter or ceramic filter.

Figure 2:
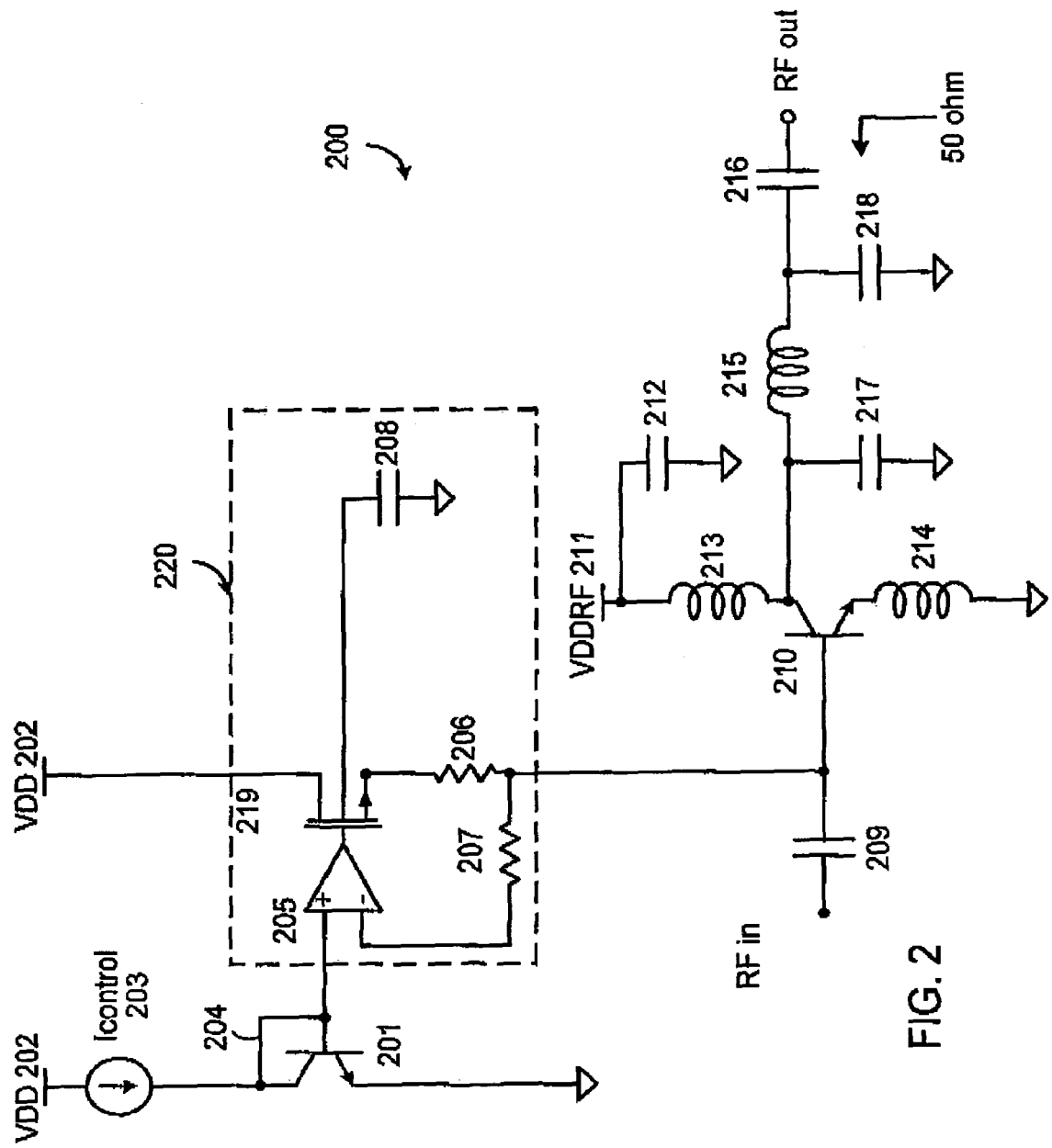
FIG. 2 shows an RF driver amplifier and its associated bias circuits.

FIG. 2 illustrates the details of a typical RF driver amplifier, such as may be employed as RF driver amplifier 12. The circuitry shown provides the necessary bias and control circuitry required to enable the RF driver amplifier 200 to operate across the entire control range required by the CDMA standard. Input voltage 202 is converted to a control current at control current source 203, which is connected to the collector of reference bipolar junction transistor (BJT) 201. A line 204 is provided to connect the base of reference BJT 201 to control current source 203. The base of reference BJT 201 and line 204 connect to unity gain operational amplifier circuit 220 including amplifier 205, NMOS transistor 219, resistors 206 and 207 and capacitor 208. The gate of NMOS transistor 219 connects to the output of amplifier 205, the source ties to resistor 206, and the drain connects to VDD 202. The RF input signal passes to capacitor 209, which combines with the signal from unity gain operational amplifier circuit 220 and passes to single inductively degenerated common emitter BJT 210. Reference voltage 211 is connected to bypass capacitor 212 and P inductor 213, which joins to the collector of single inductively degenerated common emitter BJT 210. The emitter from single inductively degenerated common emitter BJT 210 connects to emitter degeneration inductor 214 and subsequently to ground. The collector of single inductively degenerated common emitter BJT 210 is connected to the RF output via a matching circuit that includes Bond inductor 215, S capacitor 216, and intermediate ground connections via Pad capacitor 217 and Bd capacitor 218. The specific values used for the capacitance, inductance, and resistance of FIG. 2 depend on the application but may be readily determined by one skilled in the art.

The circuit of FIG. 2 operates as follows. The system generates a control current and forces the control current into reference bipolar junction transistor 201. The current at the collector of reference bipolar junction transistor 201 causes the circuit to generate a base-emitter voltage, Vbe, according to the following natural log equation:

$$Vbe = V_t * ln(Ic/Is) \quad (1)$$

where $V_t$ is the thermal voltage of the reference bipolar junction transistor 201. $V_t$ is equal to k*T/q, where k is Boltzmann's constant, T the temperature of the reference bipolar junction transistor 201 in degrees Kelvin, and q the electron charge. In Equation (1), Is is the saturation current, and Ic is the collector current at reference bipolar junction transistor 201, which is the forward active saturation current of reference bipolar junction transistor 201. Is is a function of the area of reference bipolar junction transistor 201 for a given integrated circuit fabrication process and is approximately constant for a given transistor. The base-emitter voltage Vbe of the reference bipolar junction transistor 201 may be buffered by the unity gain operational amplifier circuit 220 formed by amplifier 205, resistors 206 and 207, capacitor 208, and NMOS transistor 219. The system applies the unity gain buffered voltage to the base of the single inductively degenerated common emitter BJT 210.

The system controls the output device collector current by varying the base voltage of single inductively degenerated common emitter BJT 210. This base voltage may be varied by forcing a specific control current from a current source such as control current source 203 connected to the reference bipolar junction transistor 201 as shown. The system applies the base voltage to the output device through a unity gain buffer such as in the manner shown in FIG. 2.

The gain of the terminal is critical to operation. Generally, overall voltage gain at the terminal is proportional to transconductance and is a function of the DC bias of the circuit:

$$G = g_m * R_{out} \quad (2)$$

where G is gain at the terminal, $g_m$ is the transconductance of the common emitter BJT neglecting inductive feedback, and $R_{out}$ is output resistance. This is true for low frequencies. $g_m$ varies as shown in Equation (3):

$$g_m = Ic/V_t \quad (3)$$

where Ic is again collector current and $V_t$ is thermal voltage of single inductively degenerated common emitter BJT 210. As collector current follows the relationship:

$$Ic = Is * e^{(Vbe/Vt)} \quad (4)$$

the Vbe of reference bipolar junction transistor 201 and the RF transistor, single inductively degenerated common emitter BJT 210, are typically identical. As a result, the collector currents of reference bipolar junction transistor 201 and single inductively degenerated common emitter BJT 210 will generally be proportional to one another. Saturation current, Is, of the single inductively degenerated common emitter BJT 210 may be X times larger than that of reference bipolar junction transistor 201, where X is the ratio of emitter areas between reference bipolar junction transistor 201 and the single inductively degenerated common emitter BJT 210.

In general at high frequencies, the gain of amplifier 205 is Gain=GmZ$_L$, where Gm is the transconductance of single inductively degenerated common emitter BJT 210 with emitter degeneration inductance included, and $Z_L$ is the output impedence seen at the collector of single inductively degenerated common emitter BJT 210. This output impedence is the parallel combination of the load impedance reflected from the RF output back through the matching circuit of FIG. 2 and the output device itself. In this arrangement:

$$Gm = gm/(1 + gm*Ze) \quad (5)$$

where gm represents the bipolar transconductance and is equal to Ic/V$_t$. Ze is the value of the impedence of the emitter degeneration inductor 214, which is equal to 2*π*frequency*L, where L is the value of emitter degeneration inductor 214.

At small collector current values, gm*Ze is much less than 1. This relationship causes the RF amplifier Gm to be equal to or approximately equal to the bipolar transconductance gm. Gm represents the transconductance of single inductively degenerated common emitter BJT 210 with emitter degeneration inductance included. This indicates amplifier gain is approximately proportional to the collector current at small values of gm*Ze. For gm*Ze being much greater than 1, the value of Gm approaches 1/Ze. Thus for very large collector currents, the gain of single inductively degenerated common emitter BJT 210 is approximately constant and equal to $Z_L$/Ze.

Figure 3:
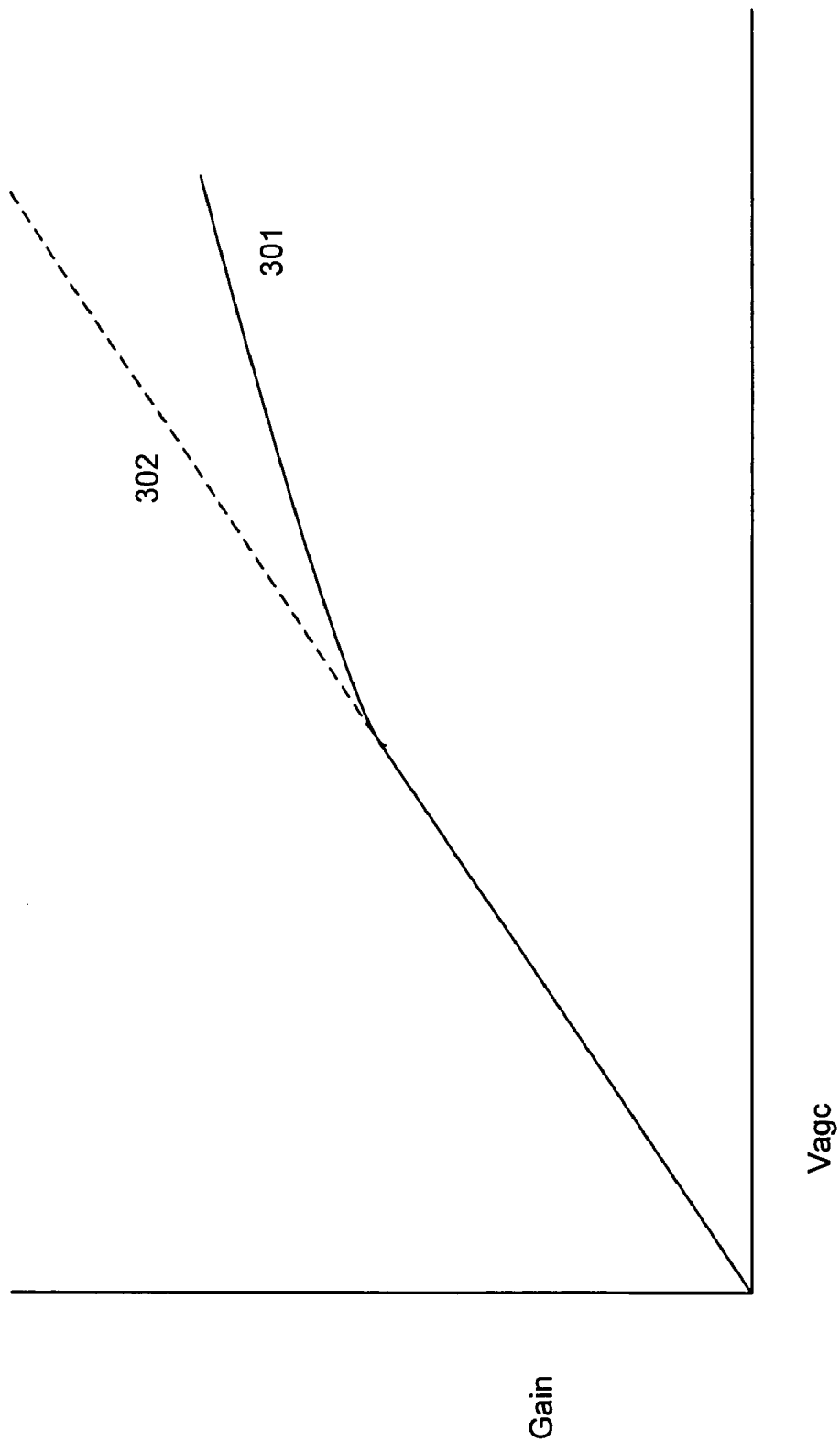
FIG. 3 is a plot of nonideal RF driver amplifier gain control characteristic as contrasted with ideal linear characteristic.

If the value of the controlling current is not properly generated in the design of FIG. 2, the nonideal characteristic of plot 301 may result, which represents a departure from the ideal linear in dB characteristic of plot 302. Other nonideal curves may result instead of the plot 301 illustrated in FIG. 3. Depending on the terminal and application, the plot 301 is therefore measured at multiple points, typically in excess of ten points across the power control range, to determine performance and provide the ability to accurately calibrate the terminal.

In the present design, the control current is varied to provide linear in decibel performance for the RF driver amplifier 200. The system derives this varied control current by obtaining an input voltage from a voltage source such as the MSM (Mobile Station Modem) and converting the voltage to the control current using different compensation techniques.

Figure 4:
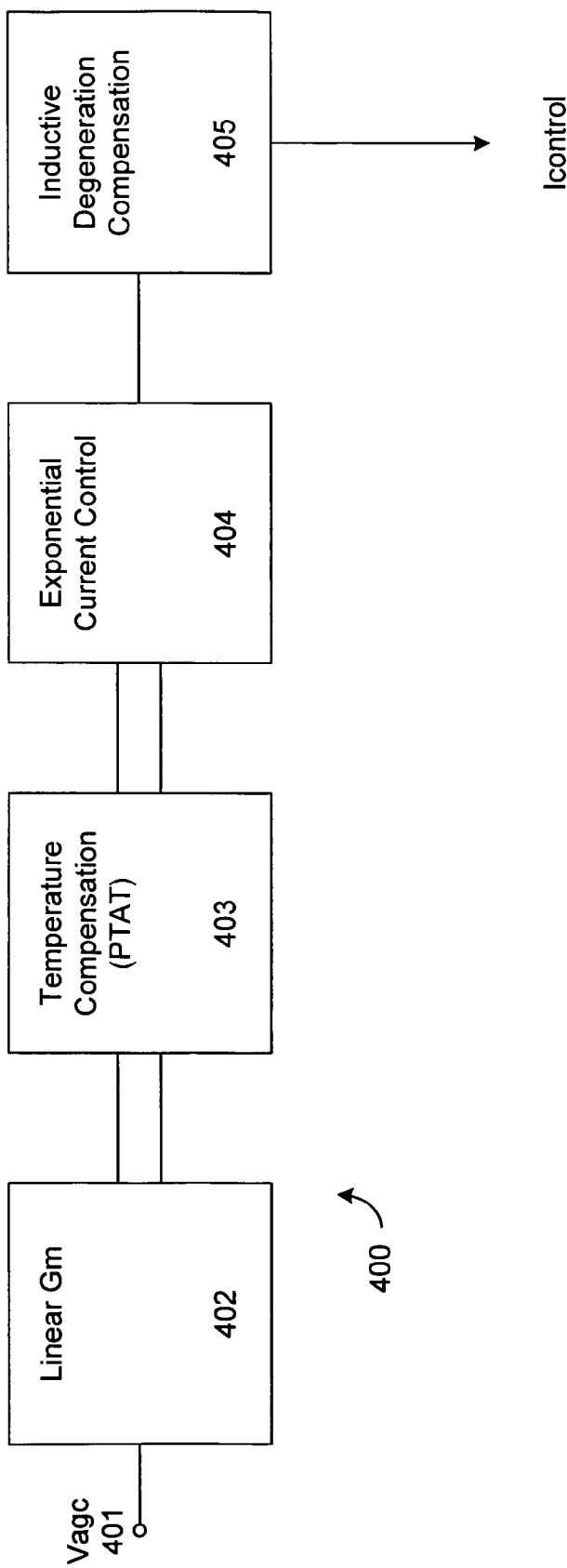
FIG. 4 illustrates a gain control block diagram that receives a control voltage and provides a reference current to the RF driver amplifier in accordance with the present invention.

The automatic gain control voltage to control current conversion is illustrated in block diagram form in FIG. 4. From FIG. 4, the automatic gain control voltage passes to linear Gm block 402. Linear Gm block 402 in this aspect converts the voltage Vagc from node 401 to a differential current. The differential aspect of linear Gm block 402 is optional, and the required aspect of linear Gm block 402 is the ability to convert voltage to current. Various devices may be employed to convert voltage to current, including but not limited to a transconductance amplifier or other transconductor, and other devices known to those skilled in the art able to linearly convert voltage into current and potentially differential current. In this aspect, differential current flows from linear Gm block 402 to temperature compensation block 403, which performs temperature compensation for the current received based on absolute temperature of the device, in this case the differential current received from linear Gm block 402. The temperature compensated differential currents are provided to exponential current control block 404, which uses aspects of the exponential collector current properties of the bipolar transistors in the gain control circuits to compensate for the exponential aspects of the collector current in the RF driver amplifier circuitry 200. The result of the exponential current control block 404 passes to inductive degeneration compensation block 405, which modifies the current from exponential current control block 404 to compensate for inductive degeneration and enable linear in decibel gain control. The result of the inductive degeneration compensation block 405 is a reference current or control current Icontrol, which is provided as current at control current source 203 shown in FIG. 2.

Figure 5:
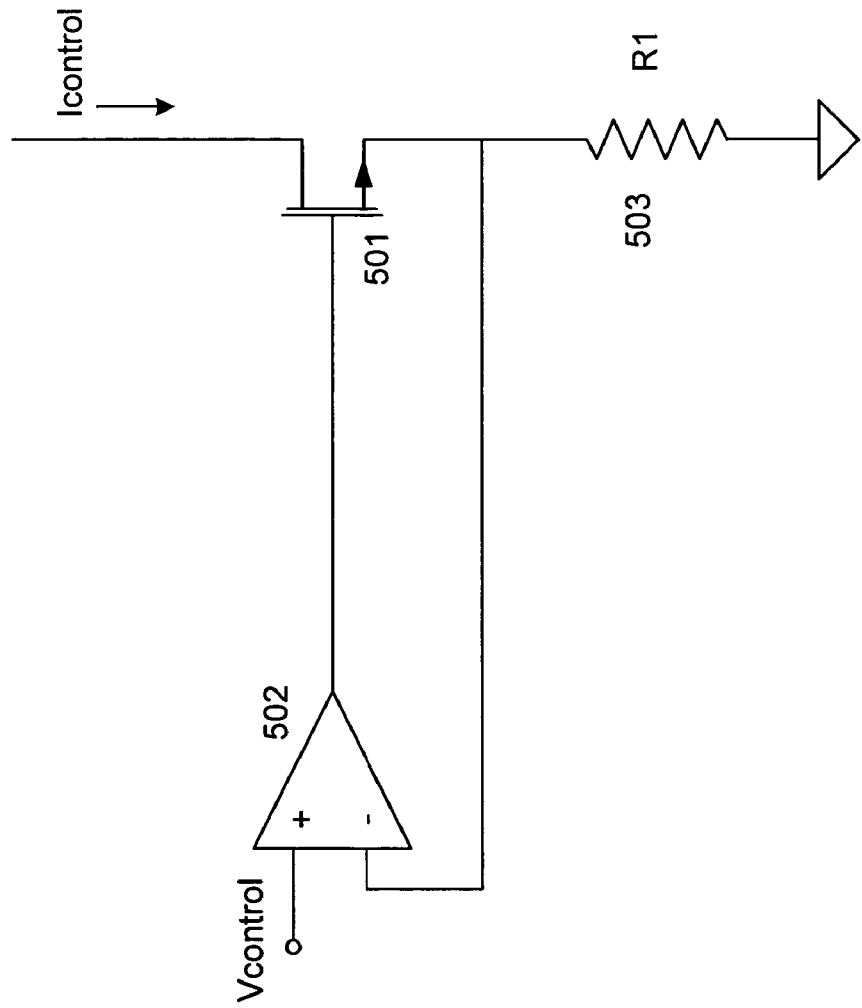
FIG. 5 is one aspect of a circuit that may be employed as the linear Gm/voltage to current converter of the present design.

One circuit that may be employed to convert voltage to current as in linear Gm block 402 is illustrated in FIG. 5 and operates using voltage from the MSM. From FIG. 5, the Vcontrol signal is converted into a current using the following equation:

$$Vcontrol/R1 = Icontrol \qquad (6)$$

Vcontrol is the control voltage applied to the positive terminal of amplifier 502, R1 the resistance of resistor 503, and Icontrol the control current resulting from NMOS transistor 501. The output of amplifier 502 connects to the gate of NMOS transistor 501. From FIG. 5, the negative terminal of amplifier 502 receives feedback from the source of NMOS transistor 501, and the source also feeds resistor R1, which is connected to ground. Icontrol varies linearly with the value of Vcontrol. This control current Icontrol and control voltage Vcontrol are used in other aspects of the design as described below.

Figure 6:
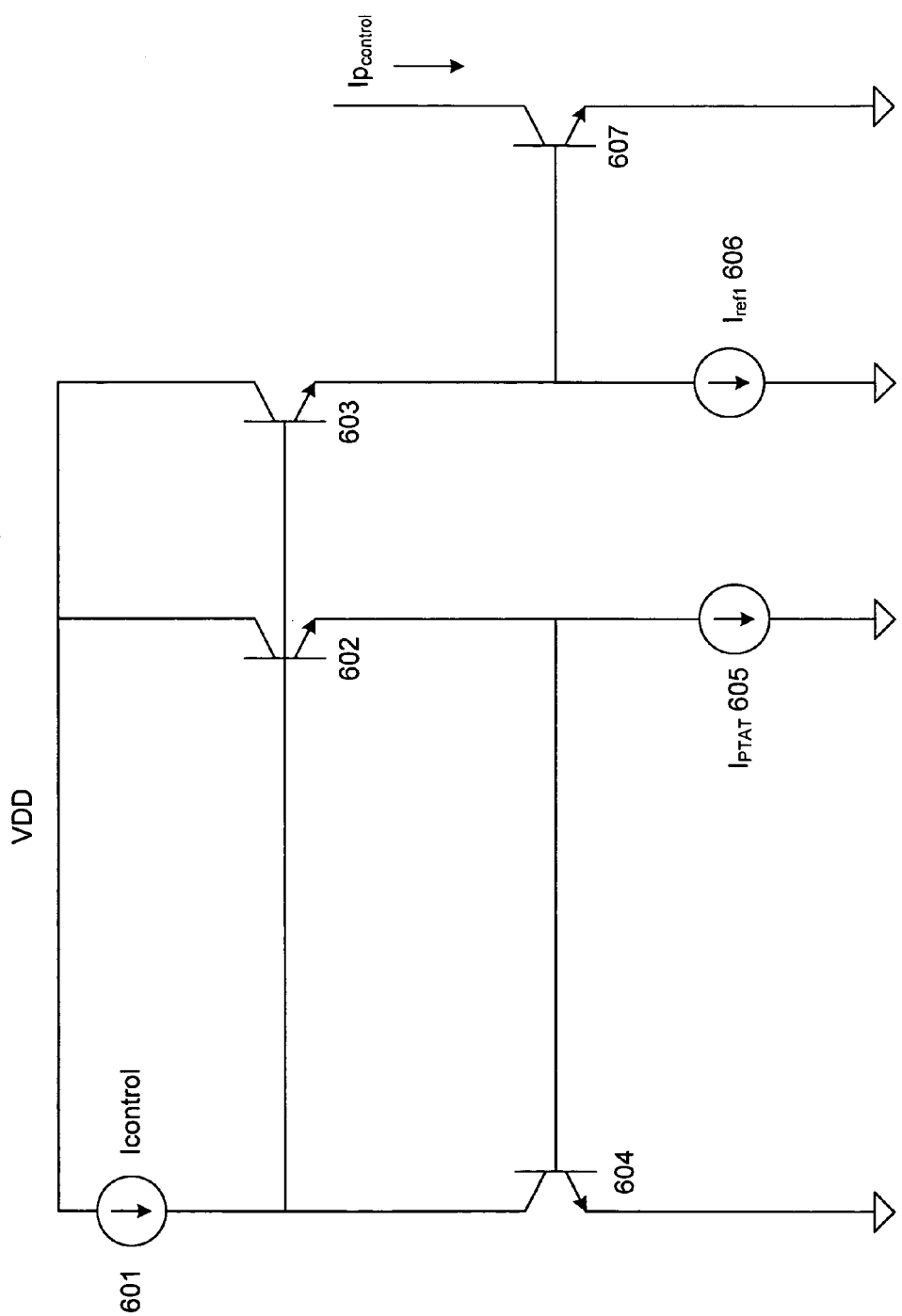
FIG. 6 illustrates one aspect of a circuit that may be employed as the PTAT (proportional to absolute temperature) temperature compensation block of the present design.

Collector current in a BJT varies according to temperature, and the present system compensates the current for temperature differences using temperature compensation block 403. Temperature compensation block 403 provides a PTAT (proportional to absolute temperature) conversion function. The function of temperature compensation block 403 is to provide an increase in current when temperature increases. Operationally, current is compensated by multiplying the current received from linear Gm block 402 by a temperature compensation factor derived from the then-existing temperature. One circuit that may be employed for temperature compensation in the present scheme is illustrated in FIG. 6. The circuitry in FIG. 6 provides the following functionality:

$$Ip_{control} = Icontrol^*(I_{PTAT}/I_{ref1}) \qquad (7)$$

where Icontrol is the control current generated from FIG. 5 and $I_{ref1}$ is a constant current that does not vary with temperature or any other parameter.

As shown in FIG. 6, voltage VDD is applied at the top of the circuit in the configuration shown, and this voltage passes to control current source 601, PTAT current BJT 602, and reference 1 current BJT 603. Output from the emitter of PTAT current BJT 602 passes to PTAT current source 605, which is connected to ground, and to the base of control current BJT 604. Output from control current source 601 passes to the base of PTAT current BJT 602, the base of reference 1 current BJT 603, and to the collector of control current BJT 604. The emitter from PTAT current BJT 602 passes to the base junction of control current BJT 604. The emitter from reference current BJT 603 passes to reference 1 current source 606, which is connected to ground. The emitter from reference 1 current BJT 603 is also connected to the base of $Ip_{control}$ current BJT 607, which receives the $Ip_{control}$ current at its collector and has its emitter connected to ground.

According to the arrangement shown in FIG. 6, and based on Equation (7), the PTAT current at PTAT current source 604 and reference 1 current at reference 1 current source 606 provide temperature compensation values for the differential current received. Icontrol is multiplied by the current at PTAT current source 604 divided by the current at reference 1 current source 606. From this circuit, it may be appreciated that PTAT compensation is roughly equivalent to taking (Vt/Vcontrol)*Icontrol, which provides Icontrol with a PTAT temperature characteristic.

Maximum compensated current, $Imax_{comp}$, is computed according to the following equation:

$$Imax_{comp} = Vcontrol_{max}/R1^*(I_{PTAT}/I_{ref1}) \qquad (8)$$

where $Vcontrol_{max}$ is the maximum value of Vcontrol, R1 the resistance used in FIG. 5, and $I_{PTAT}$ and $I_{ref1}$ as shown in FIG. 6.

Figure 7:
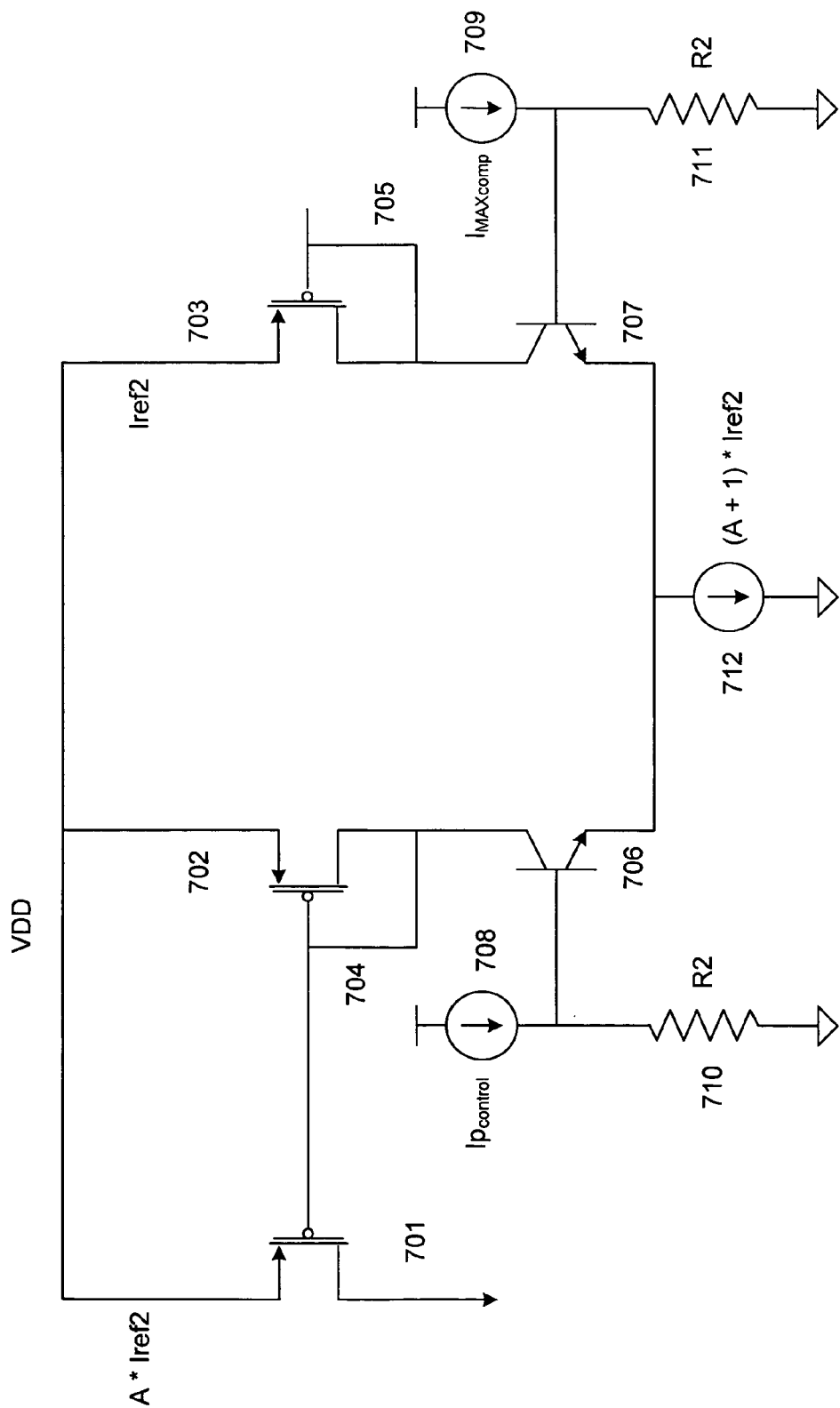
FIG. 7 shows one aspect of a circuit that may be employed as the exponential current control block of the present design.

From FIG. 7, the linear PTAT control currents Ipcontrol and $Imax_{comp}$ are converted to a temperature compensated exponential control current with a bipolar differential pair as follows:

$$I_{lindB} = I_{ref2} e^{\left[\frac{Ipcontrol*R2}{V_t}\right]} \qquad (9)$$

where $I_{lindB}$ is the linear in dB current which now varies exponentially with Ipcontrol, $I_{ref2}$ is the reference current illustrated in FIG. 6, Ipcontrol is the linear PTAT control current from FIG. 6, $V_t$ the thermal voltage, and R2 the resistances of resistor 710 or 711 of FIG. 7. Equation (9) provides a reference for linear in dB control of the DA collector current with small feedback, with an emphasis toward enabling the $V_t$ in the denominator to be cancelled. Ipcontrol is proportional to $V_t$ due to the previous temperature compensation.

To simplify the following description, a normalization factor A is employed based on Equation (9), where:

$$A = I_{lindB}/I_{ref2} = e^{((Ipcontrol*R2)/Vt)} \qquad (10)$$

Normalization factor A corresponds to an exponentially varying current that results in linear in dB gain for low currents where inductive degeneration can be neglected.

FIG. 7 illustrates a circuit that provides the exponential current control that effectively matches the exponential characteristic of the circuit shown in FIG. 2. From FIG. 7, the linear differential PTAT currents are converted to a temperature compensated exponential control current with a bipolar differential pair. The reference current, Iref2, is as shown, and is associated with PMOS transistor 703. The system multiplies reference current Iref2 by the normalization factor A at PMOS transistor 701. PMOS transistor 702 includes a bypass 704, while PMOS transistor 703 includes bypass 705. The emitter from each of PMOS transistors 702 and 703 pass to the collectors of first BJT 706 and second BJT 707, respectively. The currents received from temperature compensation block 403 are Ipcontrol and $I_{MAXcomp}$, shown at Ipcontrol current source 708 and $I_{MAXcomp}$ current source 709, respectively. Output from these current sources pass to the bases of the BJTs, specifically the output from Ipcontrol current source 708 passes to the base of first BJT 706 and the output from $I_{MAXcomp}$ current source 709 passes to the base of second BJT 707. Output from Ipcontrol current source 708 passes to resistor 710 and to ground, while output from $I_{MAXcomp}$ source 709 passes to resistor 711 and then to ground. Emitter from both first BJT 706 and second BJT 707 pass to summation source 712, which then passes to ground. The value of summation source 712 is (A+1)*Iref2. The exemplary circuit shown in FIG. 7 provides a reference for linear in dB control of the DA collector current with small inductive feedback. For larger collector currents, such as those in the range of in excess of approximately 70 percent of Vcontrol (collector currents where Gm*Ze is equal to or greater than 1), feedback from inductive degeneration in the emitter causes the characteristic to depart from linear, and the control current may be further processed to compensate for this feedback using inductive degeneration compensation.

To compensate for the inductive degeneration in the output device, an additional inductive degeneration compensation block 405 further processes the exponential control current received from the exponential circuit control block 404 for large collector currents in the output device. The degeneration compensation block compensates for inductive degeneration and provides a linear in dB characteristic across the full gain control range of the driver amplifier, primarily addressing the high end collector current range. Without this inductive degeneration compensation, the gain control characteristic would be linear in dB at low output power and plateau at high output powers.

Inductive degeneration compensation in combination with exponential control corrects deviation from linear at high collector currents. The voltage gain of the output device, namely the RF driver amplifier 200 including its associated bias circuits, for the high collector current situation, is given as approximately:

$$Av = (Gm*Z_L)/(1+Gm*Z_E) \quad (11)$$

where Gm is the transconductance of single inductively degenerated common emitter BJT 210 with emitter degeneration inductance included, $Z_L$ is the load impedance seen at the collector, $Z_E$ is emitter inductor impedence, and Av the voltage gain. Once again, normalization factor A may be employed where Av is the voltage gain and Amax is the maximum gain of the inductively degenerated transconductor:

$$A = Av/A\max \quad (12)$$

with $$A\max = Z_L/Z_E \quad (13)$$

Note that from Equation (12), normalization factor A is equal to one when Av is equal to Amax. From Equations (11) through (13), collector current is represented by:

$$Ic = (V_t/Z_L)*A\max(A/(1-A)) \quad (14)$$

The collector current that may be employed for constant normalized gain is PTAT, and thus $I_{ref3}$ is a PTAT current. Equation (14) is the bias current used to generate the linear in dB characteristic.

Again, using normalization factor A where:

$$A = I_{lindB}/I_{ref3} = e^{((Ipcontrol*R2)/Vt)} = Av/A\max \quad (15)$$

the collector current in terms of normalization factor A is:

$$I_{DAcontrol} = (I_{ref3}*A*I_{ref2})/(I_{ref2}*(1-A)) = I_{ref3}(A/(1-A)) \quad (16)$$

$I_{ref3}$ is assumed to operate as PTAT to compensate for PTAT variation of gm of the BJT. Thus $I_{ref3}$ represents a reference current that provides a constant gain versus temperature, process, and voltage. The foregoing set of equations ignores certain nonideal effects, including but not limited to $r_B$ and finite β of a typical BJT.

Figure 8:
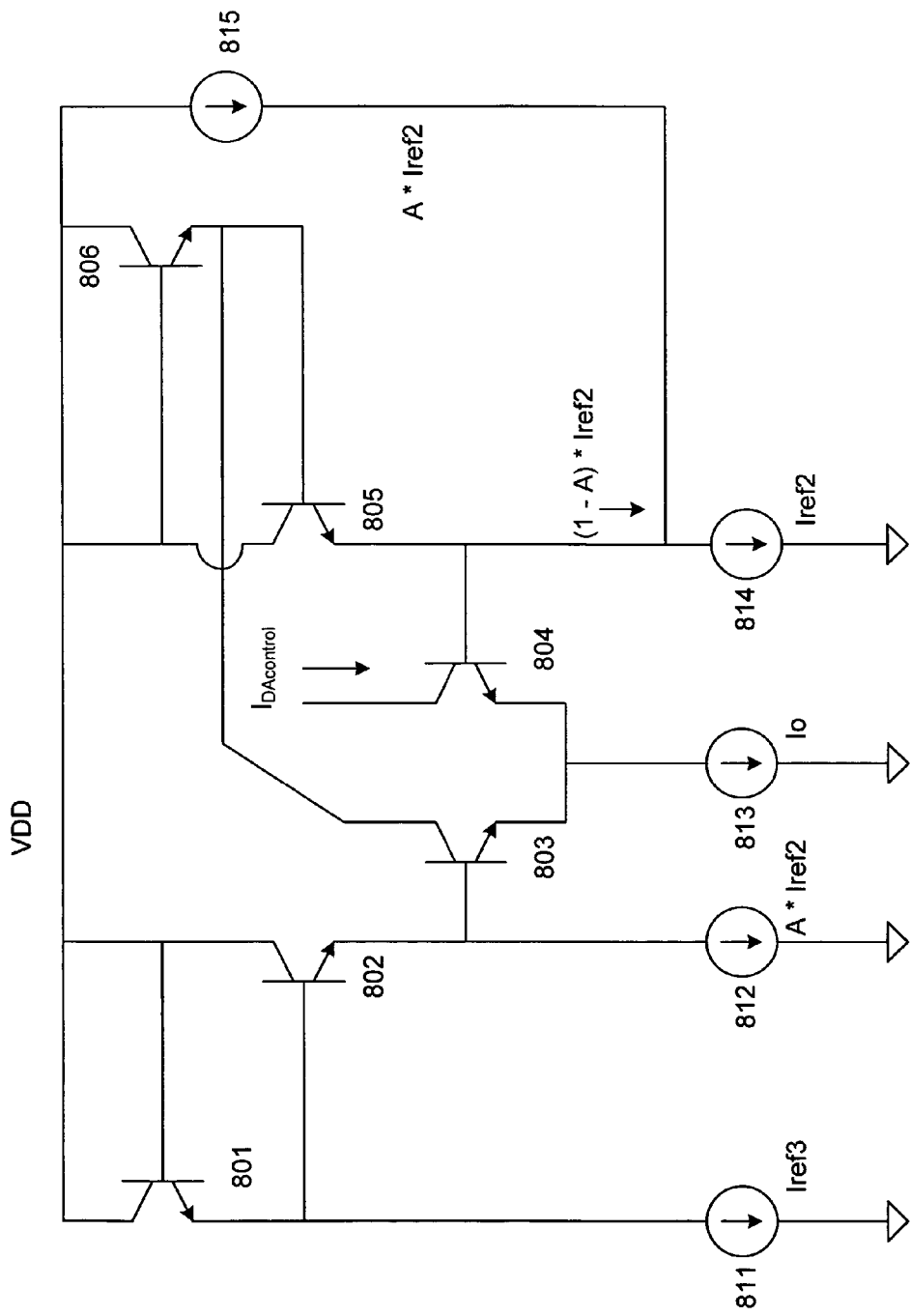
FIG. 8 is an aspect of a circuit that may be employed as an inductive degeneration compensation block of the present design.

The translinear circuit presented in FIG. 8 can be used to implement the inductive degeneration compensation function described in Equation (16). This circuit takes the output of FIG. 7, A*Iref2, which generates an exponentially varying control current for low currents and modifies the output to compensate for inductive degeneration at high currents. The combination of these two circuits enables linear in dB control across the entire gain control range. From FIG. 8, VDD is applied at the top of the circuit and enters the collectors in first BJT 801, second BJT 802, fifth BJT 805, and sixth BJT 806, as well as the bases of first BJT 801 and sixth BJT 806. The emitter from first BJT 801 passes to Iref3 current source 811 and the base of second BJT 802. The emitter of second BJT 802 passes to A*Iref2 current source 812 and to the base of third BJT 803. The emitter of sixth BJT 806 passes to the base of fifth BJT 805 and the collector of third BJT 803. Fourth BJT 804 receives IDAcontrol at its collector and passes signal from its emitter, which combines with the signal from the emitter of third BJT 803 into Io current source 813. The emitter of fifth BJT 805 provides the current (1−A)*Iref2 which combines with the output of A*Iref2 current source 815 to form the current Iref2 at Iref2 current source 814. The current (1−A)*Iref2 is also provided to the base of fourth BJT 804. A*Iref2 current source 815 receives the VDD voltage. The circuit may be used as block 405 in FIG. 4, and it provides a current limit, Io, that can avoid the singularity due to the presence of (1−A) in the denominator of Equation (16).

Adding gain control (30–40 dB) to the driver amplifier in the manner shown allows the Upconverter VGA, namely RF driver amplifier 200 from FIG. 2, to employ a robust, highly manufacturable topology with only in the range of approximately 60 dB of gain control. A linear in dB gain control characteristic may be achieved in this manner to first order in the RF driver amplifier 200 by biasing the RF driver amplifier with the exponentially varying collector current. As a result, the RF driver amplifier 200 carries a significant DC bias at rated output power in order to meet the distortion requirements of the CDMA standard. For output powers less than the maximum, the bias of the driver amplifier drops exponentially, saving considerable current drain and reducing total terminal power consumption.

For minimum output power conditions, the present design biases the output device at a very low collector current. This biasing can place RF driver amplifier 200 in an attenuation mode at low output power, thereby offering the ability to suppress noise and spurious signals and provide a better signal to noise ratio at low output power. This is increasingly important in 3G standards. It can also be very useful in suppressing LO feedthrough in direct upconversion transmitter architectures. The gain control bias circuitry described herein operates in a continuous fashion across the gain control range. As a result, there are minimal discontinuities in the gain control characteristic, enabling the closed loop power control used in a CDMA system to function properly. The gain control also allows the power consumption to be optimized to the CDMA profile. At high power the bias is large as required for linearity. For lower powers it drops off approximately exponentially. The gain control allows the RF driver amplifier 200 to enter attenuation mode at low output power, thus suppressing noise and spurious products at the output of the transmitter.

The foregoing discusses the linear in dB control and presents a sample circuit for high collector currents. For low collector currents, the gain of the single inductively degenerated common emitter BJT 210 of FIG. 2 is approximately:

$$gm^*Z_L = (Ic^*Z_L)/V_t \quad (17)$$

where gm is transcondance, Ic the collector current, $Z_L$ the output impedence seen at the collector of the single inductively degenerated common emitter BJT 210, and $V_t$ the thermal voltage of single inductively degenerated common emitter BJT 210. In decibels, the gain is given by:

$$\text{Gain(dB)} = 10^*\log((Ic^*Z_L)/V_t) \quad (18)$$

Thus the gain varies logarithmically with the collector current at low collector current levels.

The collector current will vary exponentially with respect to a linearly varying Vbe as $$Ic = Is^* e^{(Vbe/Vt)} \quad (19)$$

Substituting the Ic value of Equation (19) into the expression of Equation (18) produces:

$$\text{Gain(dB)} = 10^*\log((Is^* e^{(Vbe/Vt)})^* Z_L/V_t) \quad (20)$$

Equation (20) yields the following relationship between the gain in decibels and Vbe:

$$\text{Gain(dB)} = 10^*(Vbe/V_t) + \log(Is^* Z_L/V_t) \quad (21)$$

The log term of Equation (20) is approximately constant and the gain in dB varies linearly with Vbe. This relationship may be employed to offer linear in dB control for low collector currents and modified to allow linear in dB control at high collector currents.

The previous description of the embodiments of the invention is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A circuit for providing linear in decibel gain control in response to gain control voltage, the circuit adapted to couple to a driver amplifier circuitry including a bipolar junction transistor and a matching circuit, the circuit comprising:
    a linear transconductor receiving an input voltage and providing a control current based on input voltage received;
    temperature compensation circuitry for varying current from the linear transconductor according to absolute temperature;
    an exponential current controller receiving current varied according to temperature from the temperature compensation circuitry and providing an exponential current in response; and
    an inductive degeneration compensator for receiving exponential current from the exponential current controller and providing a control current to the driver amplifier circuitry compensating for inductive degeneration due to at least one inductor in the driver amplifier circuitry, the control current passing from the inductive degeneration compensator to the bipolar junction transistor and the matching circuit of the driver amplifier circuitry to generate an output gain that varies linearly in decibels with respect to the input voltage.

2. The circuit of claim 1, wherein the linear transconductor converts the input voltage to a differential current.

3. The circuit of claim 2, wherein the temperature compensation circuitry compensates the differential current for temperature effects by varying the differential current according to absolute temperature.

4. The circuit of claim 3, wherein the exponential current controller comprises a bipolar differential pair that converts the differential current into the exponential current.

5. The circuit of claim 1, wherein the exponential current controller and the inductive degeneration compensator correct deviation from linear performance for high collector currents.

6. The circuit of claim 1, wherein the inductive degeneration compensator employs a translinear circuit.

7. The circuit of claim 1, wherein the temperature compensation circuitry provides PTAT compensation using bipolar junction transistor circuitry.

8. The circuit of claim 7, wherein the inductive degeneration compensator employs a translinear circuit comprising bipolar junction transistor circuitry.

9. A circuit for providing linear in decibel gain control based on a voltage received, the circuit adapted to couple to a voltage to current converter that converts the voltage received into a current, the circuit comprising:
    a temperature compensation circuit that compensates the current for temperature changes into a temperature compensated current; and
    an exponential current control and inductive degeneration compensation circuit that receives the temperature compensated current and removes inductive degeneration effects to provide a reference current used to provide linear in decibel gain control.

10. The circuit of claim 9, wherein the voltage to current converter is of the type that converts the voltage received into a differential current.

11. The circuit of claim 10, wherein the temperature compensation circuit compensates the differential current for temperature effects by varying the differential current according to absolute temperature.

12. The circuit of claim 11, wherein the exponential current control and inductive degeneration compensation circuit comprises a bipolar differential pair that converts the differential current into the reference current.

13. The circuit of claim 9, wherein the exponential current control and inductive degeneration compensation circuit corrects deviation from linear performance for high collector currents.

14. The circuit of claim 9, wherein the exponential current control and inductive degeneration compensation circuit employs a translinear circuit.

15. The circuit of claim 9, wherein the temperature compensation circuit provides PTAT compensation using bipolar junction transistor circuitry.

16. The circuit of claim 15, wherein the exponential current control and inductive degeneration compensation circuit employs a translinear circuit comprising bipolar junction transistor circuitry.

17. An integrated circuit (IC) for providing linear in decibel gain control for an RF driver amplifier, comprising:
    means for temperature compensating a current into a temperature compensated current;
    means for exponentially controlling the temperature compensated current into an exponentially controlled current; and
    means for compensating for inductive degeneration of the exponentially controlled current to generate a reference current to provide linear in decibel gain control.

18. The IC of claim 17, wherein the current is a differential current.

19. The IC of claim 18, wherein the temperature compensating means compensates the differential current for temperature effects by varying the differential current according to absolute temperature.

20. The IC of claim 19, wherein the exponentially controlling means comprises a bipolar differential pair that converts the differential current into the exponentially controlled current.

21. The IC of claim 17, wherein the exponentially controlling means and the inductive degeneration compensating means correct deviation from linear performance for high collector currents.

22. The IC of claim 17, wherein the inductive degeneration compensating means comprises a translinear circuit.

23. The IC of claim 17, wherein the temperature compensating means provides PTAT compensation using bipolar junction transistor circuitry.

24. The IC of claim 23, wherein the inductive degeneration compensating means employs a translinear circuit comprising bipolar junction transistor circuitry.

25. A method of providing linear in decibel gain control in an RF driver amplifier, comprising:
receiving a current;
temperature compensating the current into a temperature compensated current;
exponentially controlling the temperature compensated circuit into an exponentially controlled current; and
compensating for inductive degeneration of the exponentially controlled current to generate a reference current to provide linear in decibel gain control.

26. The method of claim 25, further comprising applying the reference current to an RF driver amplifier circuit.

27. The method of claim 26, wherein the current is a differential current.

28. The method of claim 27, wherein the temperature compensating compensates the differential current for temperature effects by varying the differential current according to absolute temperature.

29. The method of claim 28, wherein the exponentially controlling comprises employing a bipolar differential pair for converting the differential current into the exponentially controlled current.

30. The method of claim 26, wherein the exponentially controlling and the inductive degeneration compensating correct deviation from linear performance for high collector currents.

31. The method of claim 26, wherein the inductive degeneration compensating comprises employing a translinear circuit.

32. The method of claim 26, wherein the temperature compensating provides PTAT compensation using bipolar junction transistor circuitry.

33. The method of claim 32, wherein the inductive degeneration compensating employs a translinear circuit comprising bipolar junction transistor circuitry.

34. A method for providing variable gain RF drive amplification to driver amplifier circuitry including at least one inductor, the variable gain being substantially linear in decibel gain control with respect to an input voltage from which is generated a current, comprising:
compensating the current for temperature effects by varying the current according to absolute temperature to produce a temperature compensated current;
providing a controlled exponential current based on the temperature compensated current; and
compensating for inductive degeneration in the controlled exponential current, the compensating comprising altering the current to address high current effects for at least one inductor in the driver amplifier circuitry and generating a control current passed to the driver amplifier circuitry.

35. The method of claim 34, wherein the current is a differential current derived from the voltage, and wherein the compensating comprises compensating the differential current for temperature effects by varying the differential current according to absolute temperature to produce the temperature compensated current.

36. The method of claim 35, wherein the providing the controlled exponential current comprises converting the differential current into the temperature compensated current using a bipolar differential pair.

37. The method of claim 34, wherein the providing of controlled exponential current and inductive generation compensating corrects deviation from linear performance for high collector currents.

38. The method of claim 34, wherein the providing of controlled exponential current and inductive generation compensating employs a translinear circuit.

39. The method of claim 34, wherein compensating the current for temperature effects comprises providing PTAT compensation using bipolar junction transistor circuitry.

40. The method of claim 39, wherein compensating for inductive degeneration in the controlled exponential current comprises employing a translinear circuit having bipolar junction transistor circuitry.

41. A circuit adapted to couple to a linear transconductor from which is generated a controlled current based on input voltage received, the IC comprising:
temperature compensation circuitry for varying current from the linear transconductor according to absolute temperature;
an exponential current controller receiving current varied according to temperature from the temperature compensation circuitry and providing an exponential current in response; and
an inductive degeneration compensator receiving exponential current from the exponential current controller and generating a control current to compensate for inductive degeneration.

42. The circuit of claim 41, wherein the controlled current is a differential current.

43. The circuit of claim 42, wherein the temperature compensation circuitry compensates the differential current for temperature effects by varying the differential current according to absolute temperature.

44. The circuit of claim 43, wherein the exponential current controller comprises a bipolar differential pair that converts the differential current into the exponential current.

45. The circuit of claim 41, wherein the exponential current controller and the inductive degeneration compensator correct deviation from linear performance for high collector currents.

46. The circuit of claim 41, wherein the inductive degeneration compensator employs a translinear circuit.

47. The circuit of claim 41, wherein the temperature compensation circuitry provides PTAT compensation using bipolar junction transistor circuitry.

48. The circuit of claim 41, wherein the circuit is an RF chip.

* * * * *